US008653675B2

(12) United States Patent
Zhang et al.

(10) Patent No.: US 8,653,675 B2
(45) Date of Patent: Feb. 18, 2014

(54) PACKAGE INCLUDING AT LEAST ONE TOPOLOGICAL FEATURE ON AN ENCAPSULANT MATERIAL TO RESIST OUT-OF-PLANE DEFORMATION

(75) Inventors: James Jian Zhang, Folsom, CA (US); Jason Brand, Placerville, CA (US); Jacob Brooksby, Folsom, CA (US); Dejen Eshete, Mesa, AZ (US); Myung Jin Yim, Chandler, AZ (US); Ravikumar Adimula, Chandler, AZ (US); Dan Graves, Folsom, CA (US)

(73) Assignee: Micron Technology, Inc., Boise, ID (US)

( * ) Notice: Subject to any disclaimer, the term of this patent is extended or adjusted under 35 U.S.C. 154(b) by 176 days.

(21) Appl. No.: 12/628,042

(22) Filed: Nov. 30, 2009

(65) Prior Publication Data

US 2011/0127642 A1 Jun. 2, 2011

(51) Int. Cl.
*H01L 23/28* (2006.01)
*H01L 23/29* (2006.01)

(52) U.S. Cl.
USPC .............................. 257/787; 257/788; 438/127

(58) Field of Classification Search
USPC ........... 257/787, E21.502, E21.503, E23.116, 257/E23.128; 438/127
See application file for complete search history.

(56) References Cited

U.S. PATENT DOCUMENTS

| 5,195,023 | A  | * | 3/1993 | Manzione et al. ............. 361/728 |
|---|---|---|---|---|
| 6,861,761 | B2 | * | 3/2005 | Yang et al. ...................... 257/777 |
| 2005/0067721 | A1 | * | 3/2005 | Blaszczak et al. ............. 257/787 |
| 2007/0262473 | A1 | * | 11/2007 | Yim et al. ...................... 257/787 |
| 2008/0113502 | A1 | * | 5/2008 | Low et al. ...................... 438/612 |
| 2008/0305576 | A1 | * | 12/2008 | Yu et al. ......................... 438/107 |

* cited by examiner

*Primary Examiner* — Daniel Whalen
(74) *Attorney, Agent, or Firm* — Perkins Coie LLP

(57) ABSTRACT

Embodiments include but are not limited to apparatuses and systems including semiconductor packages, e.g. memory packages, including a die and an encapsulant material formed over the die, and at least one topological feature formed on an external surface of the encapsulant material, and configured to resist out-of-plane deformation of the package. Other embodiments may be described and claimed.

22 Claims, 7 Drawing Sheets

US 8,653,675 B2

PACKAGE INCLUDING AT LEAST ONE TOPOLOGICAL FEATURE ON AN ENCAPSULANT MATERIAL TO RESIST OUT-OF-PLANE DEFORMATION

BACKGROUND

A package commonly includes a die sometimes mounted onto a carrier substrate (e.g., a printed circuit board or lead frame), and an encapsulant material encapsulating the die. Given the differences in coefficients of thermal expansion for the encapsulant material, the die, and the carrier substrate, warpage may result during temperature changes.

BRIEF DESCRIPTION OF THE DRAWINGS

Subject matter is particularly pointed out and distinctly claimed in the concluding portion of the specification. The foregoing and other features of the present disclosure will become more fully apparent from the following description and appended claims, taken in conjunction with the accompanying drawings. Understanding that these drawings depict only several embodiments in accordance with the disclosure and are, therefore, not to be considered limiting of its scope, the disclosure will be described with additional specificity and detail through use of the accompanying drawings, in which:

Figure 1:
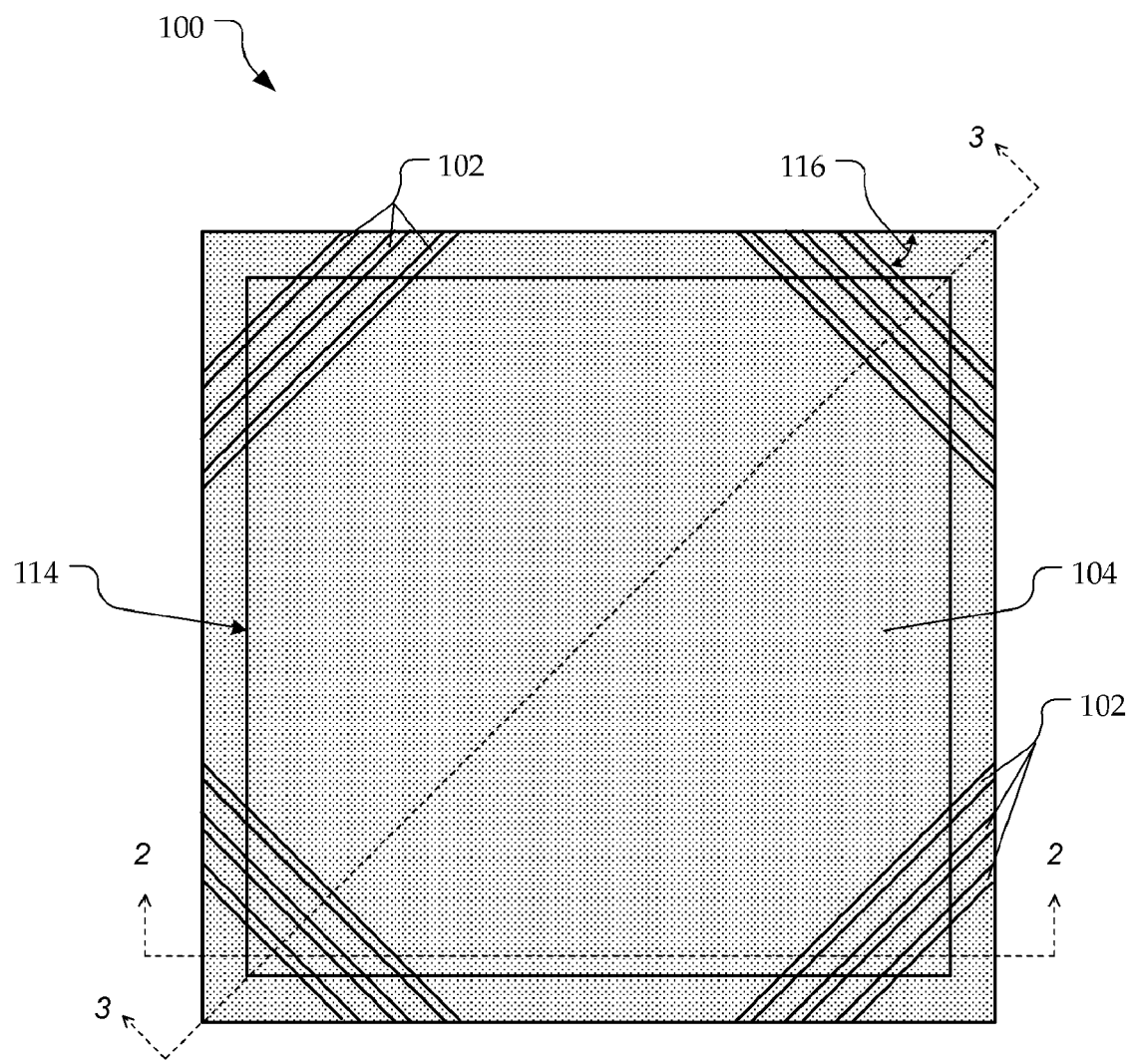
FIG. 1 illustrates an example package including at least one topological feature formed on an external surface of an encapsulant material formed over a die of the package.

all arranged in accordance with various embodiments of the present disclosure.

DETAILED DESCRIPTION OF THE EMBODIMENTS

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein, and illustrated in the Figures, can be arranged, substituted, combined, separated, and designed in a wide variety of different configurations, all of which are explicitly contemplated herein.

This disclosure is generally drawn, inter alia, to a package including at least one topological feature formed on an external surface of an encapsulant material formed over a die of the package. Embodiments include, but are not limited to, methods, apparatuses, and systems. Other embodiments may also be disclosed and claimed.

The present disclosure recognizes that temperature changes can cause different materials of a package with different coefficients of thermal expansion to expand and/or contract at different rates, and that static force stress may increase as the distance from the center of the package increases. The present disclosure further recognizes that thermal-induced stress may result in warpage such as, for example, out-of-plane deformation.

The present disclosure is drawn to an apparatus that may avoid an impact of thermal-induced stress to a package by including at least one topological feature formed on an external surface of an encapsulant material formed over a die of the package.

Figure 2:
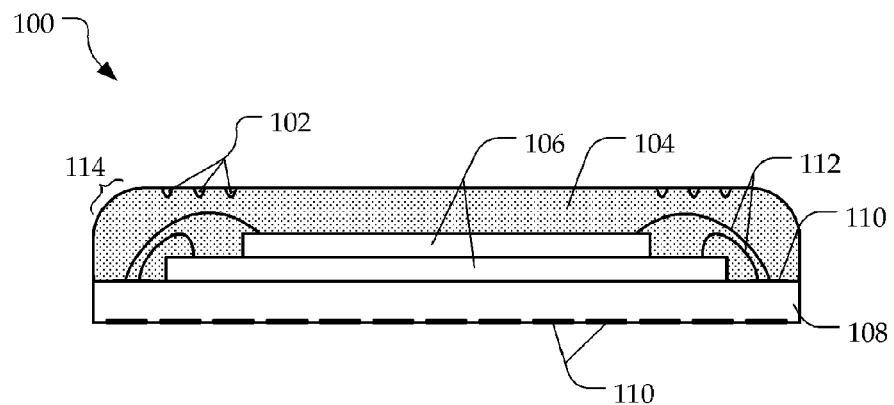
FIG. 2 illustrates a cross-sectional view of the package of FIG. 1 taken along line 2-2.
Figure 3:
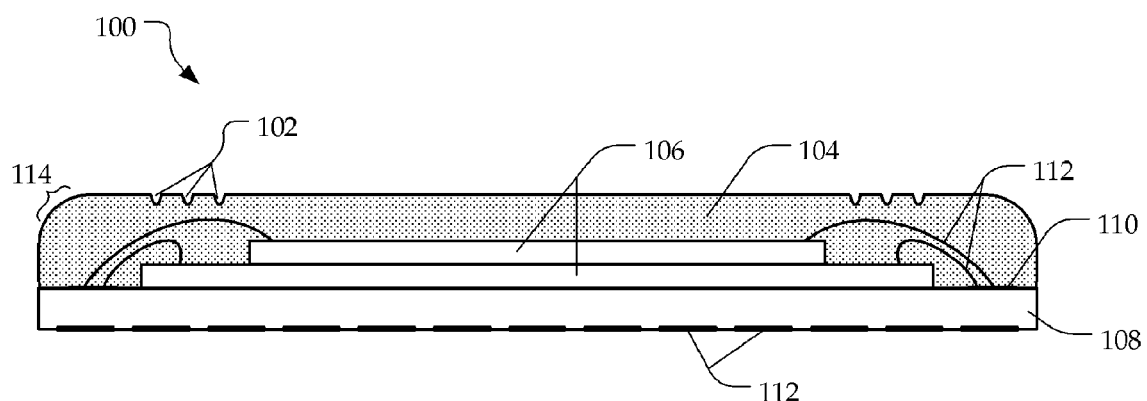
FIG. 3 illustrates a cross-sectional view of the package of FIG. 1 taken along line 3-3.

FIG. 1 illustrates an example package 100 comprising at least one topological feature 102 formed on an external surface of the encapsulant material 104, arranged according to at least some embodiments described herein. FIG. 2 illustrates a cross-sectional view of the package 100 of FIG. 1 taken along line 2-2, while FIG. 3 illustrates a cross-sectional view of the package 100 taken along line 3-3.

The package 100 may include at least one die 106 (two are illustrated) and the encapsulant material 104 may be formed over the at least one die 106. The at least one die 106 may be coupled to a carrier substrate 108. The carrier substrate 108 may include conductive traces or pads 110 for routing signals to and/or from the at least one die 106. The at least one die 106 may be electrically coupled by wires 112 to the conductive traces or pads 110 of the carrier substrate 108.

The at least one topological feature 102 may be configured to resist out-of-plane deformation of the package 100. The arrangement of the at least one topological feature 102 may be designed based at least in part on a warpage strain energy balance of the package 100 to minimize warpage of the package 100. In various embodiments, the arrangement of the at least one topological feature 102 may tend to make the coefficients of thermal expansion for the various materials of the package 100 (e.g., the die 106, the carrier substrate 108, and/or the encapsulant material 104) to deform the package 100 in-plane rather than out-of-plane, which may result in less damage to the package 100. The at least one topological feature 102 may be particularly designed to minimize warpage of the package 100 during thermal and/or other environmental exposure.

Figure 4:
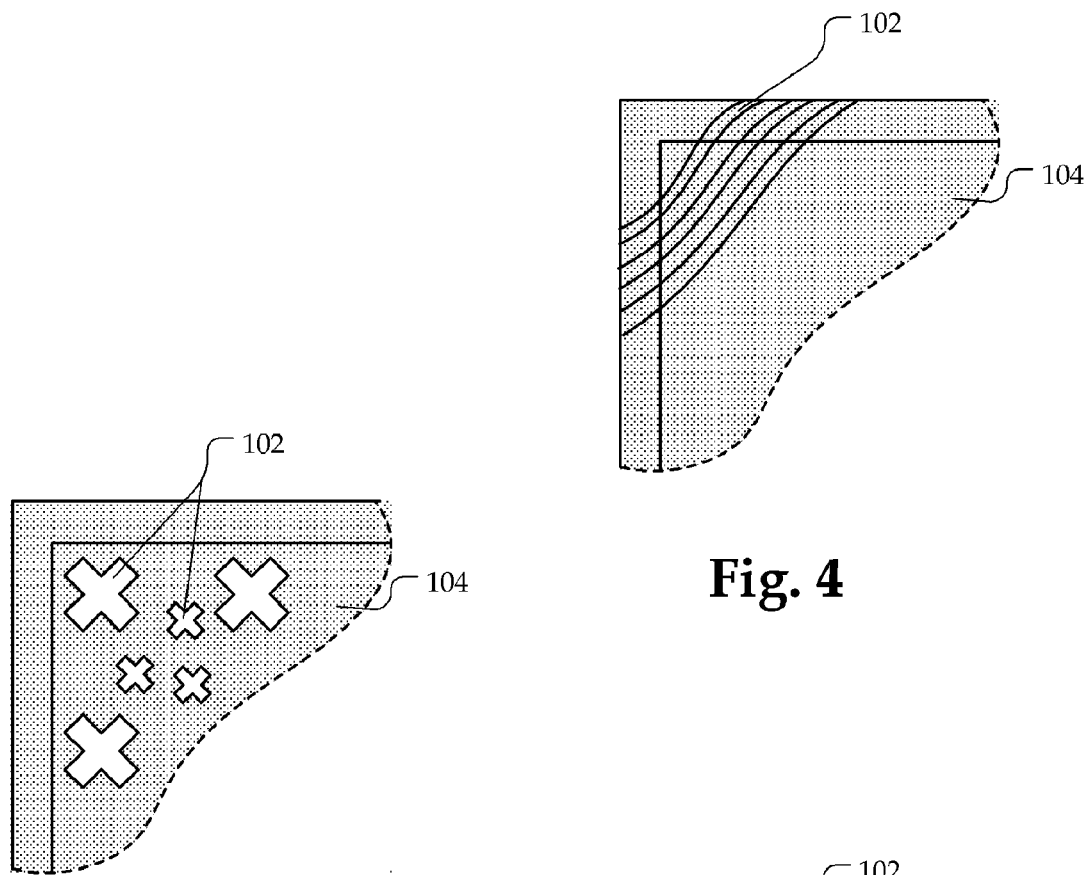
FIG. 4 illustrates a magnified view of an example topological feature configuration.

The at least one topological feature 102 may have one or more of a variety of shapes, orientations, and/or sizes. As illustrated in FIGS. 1-3, the at least one topological feature 102 may comprise at least one groove formed in straight lines. Other configurations may be possible. For example, the at least one topological feature 102 may comprise one or more curved lines, as illustrated in FIG. 4.

Figure 5:
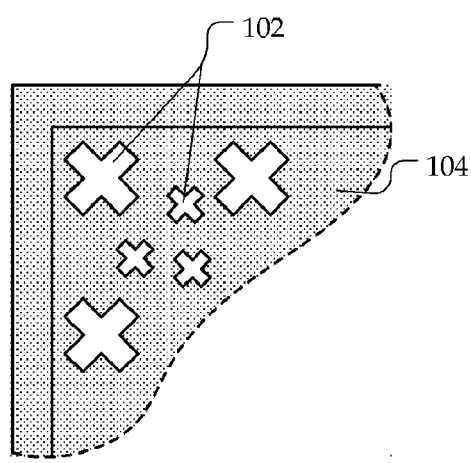
FIG. 5 illustrates a magnified view of another example topological feature configuration.
Figure 6:
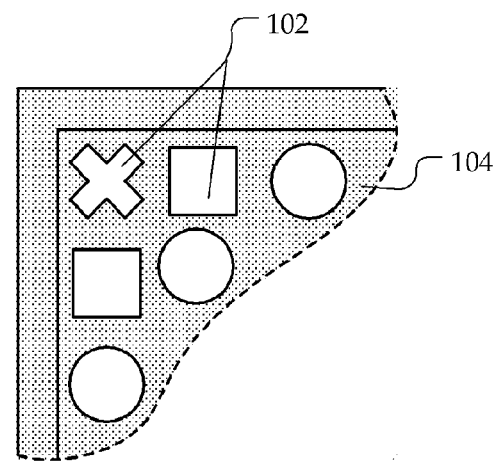
FIG. 6 illustrates a magnified view of another example topological feature configuration.

The at least one topological feature 102 may comprises at least one recess formed on the external surface of the encapsulant material 104. As illustrated in FIG. 5, the at least one topological feature 102 may comprise a plurality of X-shaped recesses in varying sizes. The at least one topological feature 102 may comprise square-shaped recesses and/or circularshaped recesses, as illustrated in FIG. 6. Numerous other configurations for the at least one topological feature 102 are possible.

The at least one topological feature 102 may be arranged at an angle 116 from an edge 114 of the external surface of the encapsulant material 104, wherein the angle is adapted to resist out-of-plane deformation of the package 100. In various embodiments, the at least one topological feature 102 may be arranged at substantially 45 degrees from an edge 114 of the external surface of the encapsulant material 104, as illustrated in FIG. 1. For embodiments in which the at least one topological feature 102 includes a plurality of recess, the recesses may be aligned at substantially 45 degrees from an edge 114 of the external surface of the encapsulant material 104. Other angles may be similarly configured to restrict out-of-plane deformation of the package 100.

At least one edge 114 of the external surface of the encapsulant material 104 may be chamfered, as illustrated. The chamfering of the edge 114 may be have an effect of further minimizing warpage of the package 100. In various embodiments, the package 100 may include chamfering in addition to or instead of including the at least one topological feature 102

Figure 7:
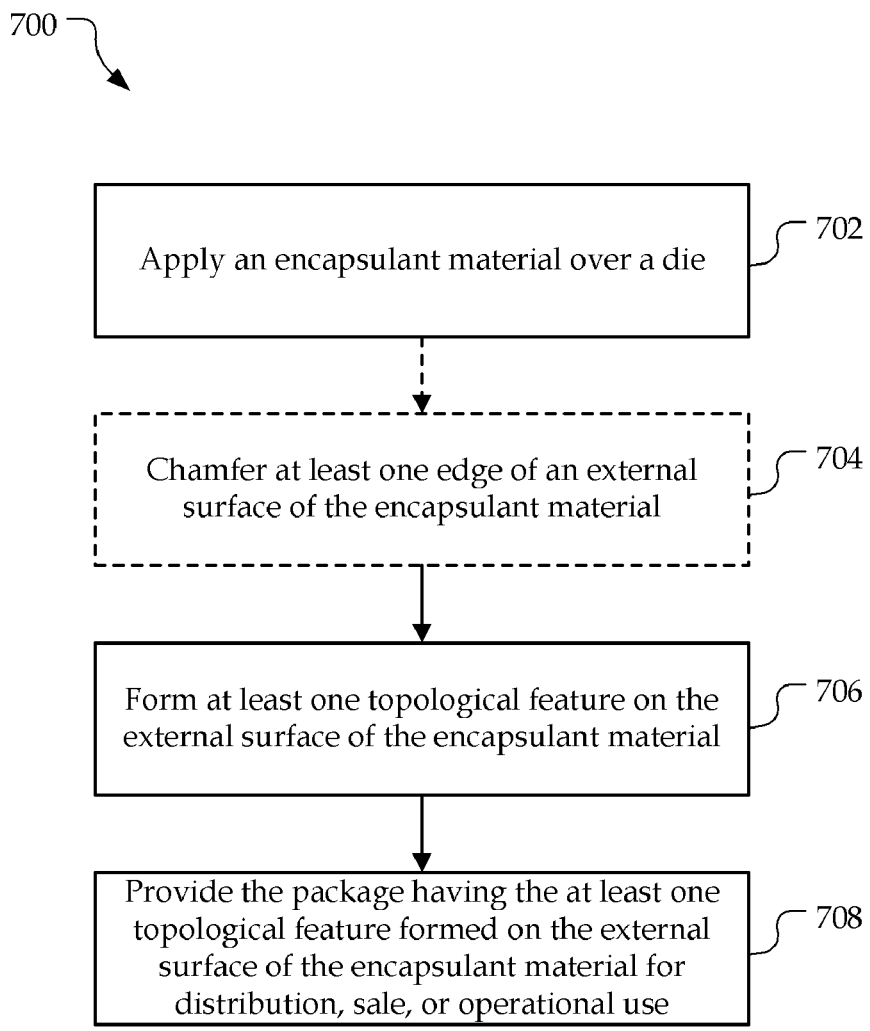
FIG. 7 is a flow diagram illustrating some of the operations associated with an example method of making a package including at least one topological feature on an external surface of an encapsulant material.

The packages of FIGS. 1-6 may be more clearly understood with reference to FIG. 7. FIG. 7 is a flow diagram illustrating some of the operations associated with an example method of making a package including at least one topological feature on an external surface of an encapsulant material, arranged in accordance with at least some embodiments of the present disclosure. It should be noted that although the method is illustrated as a series of sequential steps, the method is not necessarily order dependent. Moreover, methods within the scope of this disclosure may include more or fewer steps than that illustrated.

Turning now to FIG. 7, with continued reference to various elements of the apparatuses of FIGS. 1-6, the method 700 may include one or more functions, operations, or actions as is illustrated by any one or more of blocks 702-708. Processing for the method 700 may start with block 702, "Apply an encapsulant material over a die." Any suitable encapsulation material (sometimes referred to in the art as mold compound) may be used including, for example, a resin, epoxy, or the like. The encapsulation material may include one or more fillers, hardeners, and/or other additives. The die may be encapsulating using any suitable encapsulation method including, for example, transfer molding.

From block 702, the method 700 may proceed to optional block 704, "Chamfer at least one edge of an external surface of the encapsulant material." The at least one edge of the encapsulant material may be chamfered using any suitable method including, for example, abrading or cutting. In various embodiments, the at least one edge of the encapsulant material may be chamfered simultaneously to application of the encapsulant material at block 702 by using a mold having the desired chamfered shape. Other methods for chamfering the at least one edge of the encapsulant material may be similarly suitable.

From block 704, the method 700 may proceed to block 706, "Form at least one topological feature on the external surface of the encapsulant material." Forming the at least one topological feature may include laser cutting the at least one topological feature into the encapsulant material. In various embodiments, the laser cutting may be performed immediately before or after laser marking the package (e.g., when putting the device number or type, etc., on the package). In various embodiments, the at least one topological feature may be formed simultaneously to application of the encapsulant material at block 702 by using a mold having the desired topological features.

Forming the at least one topological feature may include forming at least one groove, in straight and/or curved lines. In various embodiments, forming the at least one topological feature may include forming at least one recess in the encapsulant material. The at least one topological feature may be formed at substantially 45 degrees from an edge of the external surface of the encapsulant material.

From block 706, the method 700 may proceed to block 708, "Provide the package having the at least one topological feature formed on the external surface of the encapsulant material for distribution, sale, or operational use." In various embodiments, for example, the package having the at least one topological feature may be distributed to wholesale or retail vendors, or to locations ready for distribution to wholesale or retail vendors, or may be sold or made available for purchase. In various embodiments, the package having the at least one topological feature formed on the external surface of the encapsulant material may be installed to one or more other devices that are provided for distribution, sale, or operational use. Devices may include, but are not limited to, various computing and/or consumer electronic devices/appliances, such as desktop or laptop computers, servers, set-top boxes, digital reorders, game consoles, personal digital assistants, mobile phones, digital media players, and digital cameras.

The method 700 of FIG. 7 may be more clearly understood with reference to FIGS. 8-13, with continued reference to various elements of the packages of FIGS. 1-6. FIGS. 8-13 illustrate cross-sectional views of various stages of a package including at least one topological feature on an external surface of an encapsulant material, manufactured with an example method, arranged according to at least some embodiments described herein.

Figure 8:
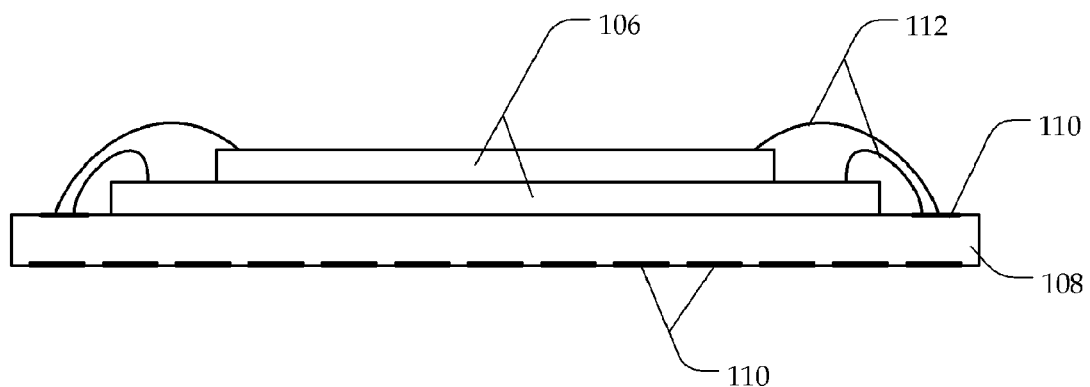
FIGS. 8-11 illustrate cross-sectional views of various stages of a package including at least one topological feature formed on an external surface of an encapsulant material, manufactured with an example method.

As illustrated in FIG. 8, at least one die 106 may be provided. The die 106 may be coupled to a carrier substrate 108, and electrically coupled by wires 112 to the conductive traces or pads 110 of the carrier substrate 108.

Figure 9:
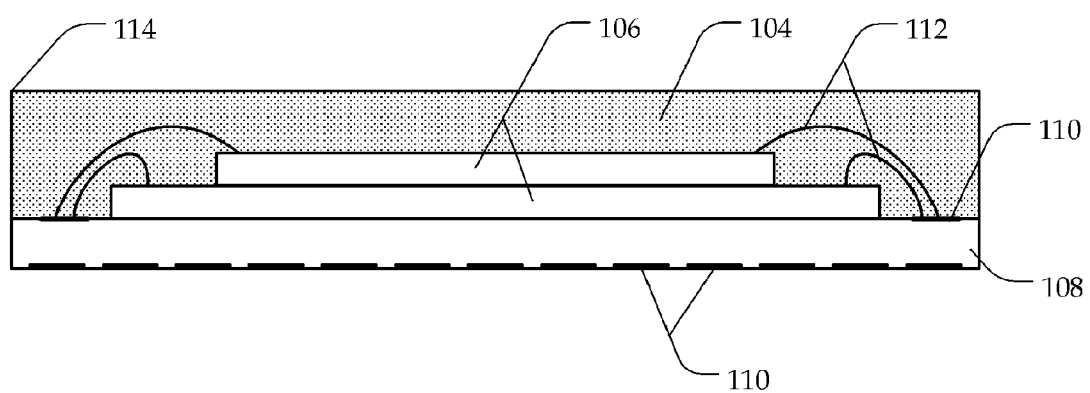
Figure 10:
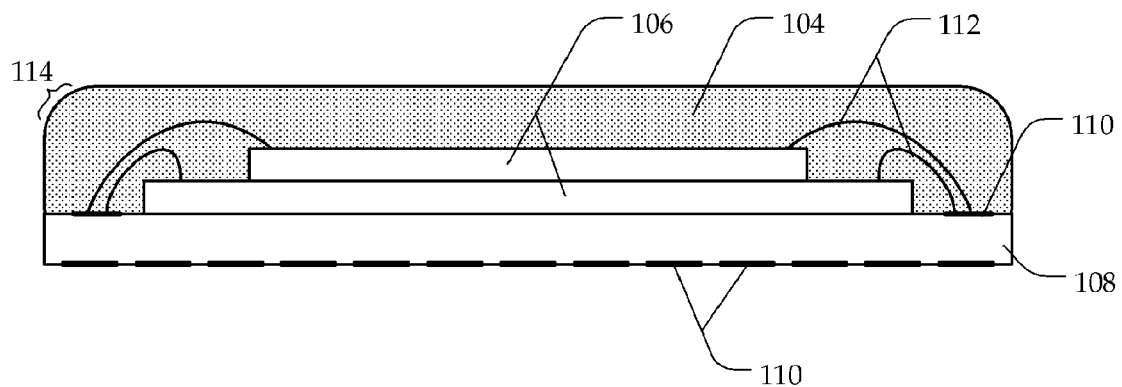

An encapsulant material 104 may then be applied over the die 106, as illustrated in FIG. 9. At least one of the edges 114 of the encapsulant material 104 may be chamfered, as illustrated in FIG. 10. As described herein, in various embodiments, the at least one edge 114 of the encapsulant material 104 may be chamfered simultaneously to application of the encapsulant material 104, at FIG. 9, by using a mold (not illustrated) having the desired chamfered shape.

Figure 11:
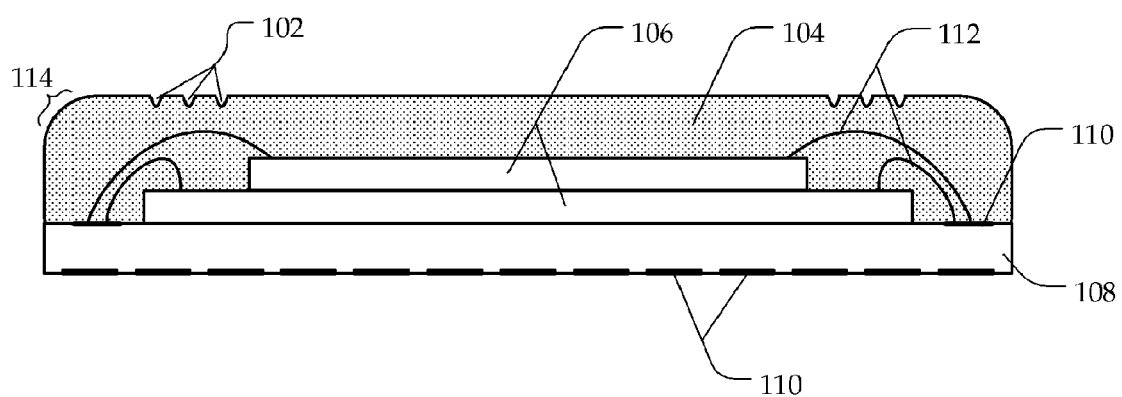

Then, at FIG. 11, at least one topological feature 102 on the external surface of the encapsulant material 104. As described herein, in various embodiments the at least one topological feature 102 may be formed simultaneously to application of the encapsulant material 104, at FIG. 9, by using a mold having the desired topological features.

Figure 12:
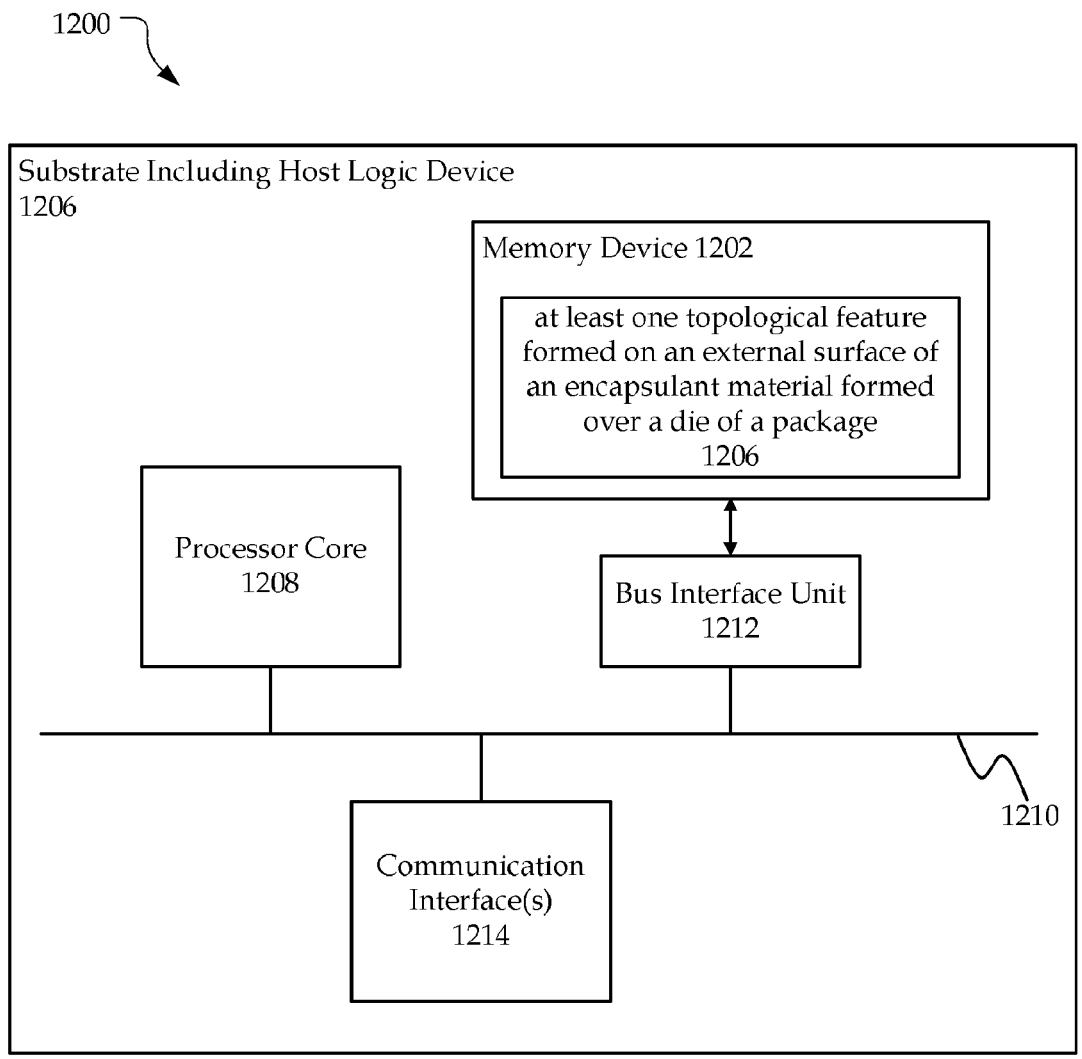
FIG. 12 is a block diagram of an example system including an apparatus comprising a package including at least one topological feature formed on an external surface of an encapsulant material formed over a die of the package.

Embodiments of apparatuses described herein may be incorporated into various other apparatuses and systems, including but are not limited to various computing and/or consumer electronic devices/appliances, such as desktop or laptop computers, servers, set-top boxes, digital reorders, game consoles, personal digital assistants, mobile phones, digital media players, and digital cameras. A block diagram of an exemplary system 1200 is illustrated in FIG. 12. As illustrated, the system 1200 may include a memory device 1202. In various embodiments, memory device 1202 may be a volatile or a non-volatile memory device. In various embodiments, memory device 1202 may be a NAND, NOR, or phase change non-volatile flash memory device. In various embodiments, memory device 1202 may include a memory apparatus comprising a package including at least one topological feature on an external surface of an encapsulant material (collectively, 1204).

In various embodiments, memory device 1202 may be operatively coupled to a host logic device 1206. In various embodiments, the host logic device 1206 may be mounted to the same substrate memory device 1202 is mounted. In other embodiments, memory device 1202 may be joined with host logic device 1202. In various embodiments, the host logic device 1206 may be a microcontroller, a digital signal processor or a general purpose microprocessor. In various embodiments, the host logic device 1206 may include a processor core 1208 or a plurality of processor cores 1208.

In various embodiments, the system 1200 may comprise a host logic device bus 1210 to operatively couple the memory device 1202 and the host logic device 1206, including electrically coupling memory device 1202 and the host logic device 1206. In various embodiments, host logic device bus 1210 may be disposed on a substrate to which both memory 1202 and host logic device 1206 are mounted.

In various embodiments, the system 1200 may further include communications interface(s) 1214 (coupled e.g., also to host logic device bus 1210) to provide an interface for system 1200 to communicate over one or more networks and/or with any other suitable device. Communications interface(s) 1214 may include any suitable hardware and/or firmware. Communications interface(s) 1214 for one embodiment may include, for example, a network adapter, a wireless network adapter, a telephone modem, and/or a wireless modem. For wireless communications, communications interface(s) 1214 for one embodiment may use one or more antennas (not illustrated).

With respect to the use of substantially any plural and/or singular terms herein, those having skill in the art may translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

Various operations may be described as multiple discrete operations in turn, in a manner that may be helpful in understanding embodiments; however, the order of description should not be construed to imply that these operations are order-dependent. Also, embodiments may have fewer operations than described. A description of multiple discrete operations should not be construed to imply that all operations are necessary. Also, embodiments may have fewer operations than described. A description of multiple discrete operations should not be construed to imply that all operations are necessary.

In addition, where features or aspects of the disclosure are described in terms of Markush groups, those skilled in the art will recognize that the disclosure is also thereby described in terms of any individual member or subgroup of members of the Markush group.

As will be understood by one skilled in the art, for any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," "greater than," "less than," and the like include the number recited and refer to ranges which can be subsequently broken down into subranges as discussed above. Finally, as will be understood by one skilled in the art, a range includes each individual member.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

What is claimed is:

1. An apparatus comprising:
   a package including a die and an encapsulant material formed over the die;
   a plurality of first topological features formed proximate to a first corner of an external surface of the encapsulant material and each of the first topological features spans from a first edge of the external surface to a second edge adjacent to the first edge, and the first topological features are configured to resist out-of-plane deformation of the package; and a plurality of second topological features formed proximate to a second corner of the external surface of the encapsulant material and each of the second topological features spans from the second edge to a third edge, wherein a central section of the second edge is completely free of any grooves and extends between the plurality of first topological features and the plurality of second topological features, wherein a completely grooveless region of the external surface extends from the central section of the second edge to a central section of the first edge and extends between the plurality of the first topological features and the plurality of the second topological features, and wherein the central section of the first edge is completely free of any grooves.

2. The apparatus of claim 1, wherein the plurality of first topological features comprises a plurality of grooves formed on the external surface of the encapsulant material.

3. The apparatus of claim 2, wherein the plurality of grooves are formed at substantially 45 degrees from an edge of the external surface.

4. The apparatus of claim 1, wherein the plurality of first topological features comprises a plurality of grooves formed in a top surface of the encapsulant material.

5. The apparatus of claim 1, wherein the plurality of first topological features comprises a plurality of recesses formed on the external surface of the encapsulant material.

6. The apparatus of claim 1, wherein the plurality of first topological features comprises a plurality of recesses aligned at substantially 45 degrees from an edge of the external surface.

7. The apparatus of claim 1, wherein at least one edge of the external surface is rounded.

8. The apparatus of claim 1, wherein the plurality of first topological features is further configured to cause in-plane deformation of the package.

9. The apparatus of claim 1, wherein an entire area of a portion of the external surface located directly between the plurality of first topological features and the plurality of second topological features is free of any recess.

10. The apparatus of claim 1, wherein the first topological features are grooves that extend along corresponding straight paths extending between the first edge and the second edge.

11. The apparatus of claim 1, wherein the completely grooveless region extends across most of the external surface of the encapsulant material and to the first edge, the second edge, and the third edge.

12. An apparatus comprising:
a package including a die and an encapsulant material formed over the die, wherein at least one edge of an external surface of the encapsulant material is rounded, wherein a plurality of first recesses extends between a first edge of the external surface and a second edge of the external surface, wherein a plurality of second recesses extends between the second edge of the external surface and a third edge of the external surface, wherein a section of the second edge extending between the plurality of first recesses and the plurality of second recesses is completely free of any recesses, and wherein a grooveless area of the external surface extends from the section of the second edge to a central section of the first edge.

13. The apparatus of claim 12, wherein at least one of the first recesses is configured to resist out-of-plane deformation of the package.

14. The apparatus of claim 12, wherein at least one of the first recesses comprises a groove formed on the external surface of the encapsulant material.

15. A method comprising:
forming at least one topological feature on an external surface of an encapsulant material formed over a die of a package, wherein the at least one topological feature includes a plurality of first recesses and a plurality of second recesses positioned along the external surface, each first recess extends between a first edge of the external surface and a second edge of the external surface, wherein each second recess extends between the second edge of the external surface and a third edge of the external surface, a section of the second edge between the plurality of first recesses and the plurality of second recesses is completely free of any recesses, and a completely grooveless region of the external surface extends from the section of the second edge to a central section of the first edge adjacent to the plurality of first recesses; and providing the package having the at least one topological feature formed on the external surface of the encapsulant material for distribution, sale, or operational use.

16. The method of claim 15, wherein the forming the at least one topological feature comprises forming the first recesses on the external surface of the encapsulant material.

17. The method of claim 15, wherein the forming the at least one topological feature comprises laser cutting the escapsulant material to form the plurality of first recesses.

18. The method of claim 15, further comprising rounding at least one edge of the external surface.

19. A system comprising:
a substrate including a host logic device bus;
a flash memory device including a package physically coupled to the substrate, wherein the package includes at least one die and an encapsulant material formed over the die, wherein at least one first topological feature is formed on an external surface of the encapsulant material and spans from a first edge of the external surface to a second edge adjacent to the first edge to resist out-of-plane deformation of the package, wherein at least one second topological feature is formed on the external surface of the encapsulant material and spans from the second edge of the external surface to a third edge adjacent to the second edge to resist out-of-plane deformation of the package, wherein a completely grooveless region of the external surface extends from a central section of the second edge to a central section of the first edge, the central section of the second edge extends between the at least one first topological feature and the at least one second topological feature, wherein the at least one first topological feature comprises a plurality of first grooves, wherein the at least one second topological feature comprises a plurality of second grooves, and wherein the flash memory device is electrically coupled to the host logic device bus; and a host logic device physically mounted to the substrate, and electrically coupled with the host logic device bus.

20. The system of claim 19, wherein the flash memory device comprises phase change memory device.

21. The system of claim 19, wherein the host logic device comprises a plurality of processor cores.

22. The system of claim 19, wherein the system is a selected one of a set-top box, a digital recorder, a game console, a personal digital assistant, a mobile phone, a digital media player, or a digital camera.

\* \* \* \* \*

UNITED STATES PATENT AND TRADEMARK OFFICE
CERTIFICATE OF CORRECTION

| | |
|---|---|
| PATENT NO. | : 8,653,675 B2 |
| APPLICATION NO. | : 12/628042 |
| DATED | : February 18, 2014 |
| INVENTOR(S) | : James Jian Zhang et al. |

It is certified that error appears in the above-identified patent and that said Letters Patent is hereby corrected as shown below:

In the Claims

In column 7, line 23, In Claim 3, delete "an" and insert -- the first --, therefor.

In column 8, line 30, In Claim 17, delete "escapsulant" and insert -- encapsulant --, therefor.

Signed and Sealed this
Twenty-second Day of April, 2014

Michelle K. Lee
*Deputy Director of the United States Patent and Trademark Office*